United States Patent [19]
Daikuhara et al.

[11] Patent Number: 6,129,555
[45] Date of Patent: Oct. 10, 2000

[54] JACK CONNECTOR, PLUG CONNECTOR AND CONNECTOR ASSEMBLY

[75] Inventors: Osamu Daikuhara; Tadashi Kumamoto; Junichi Akama, all of Tokyo, Japan

[73] Assignee: Fujitsu Takamisawa Component Limited, Tokyo, Japan

[21] Appl. No.: 09/185,512

[22] Filed: Nov. 4, 1998

[30] Foreign Application Priority Data

Aug. 17, 1998 [JP] Japan .................................. 10-230891

[51] Int. Cl.[7] ...................................................... H01R 9/09
[52] U.S. Cl. ............................................. 439/60; 439/608
[58] Field of Search ................................... 439/607, 608, 439/108, 60, 101

[56] References Cited

U.S. PATENT DOCUMENTS

| | | | |
|---|---|---|---|
| 3,399,372 | 8/1968 | Uberbacher | 439/108 |
| 4,762,500 | 8/1988 | Dola et al. . | |
| 5,035,632 | 7/1991 | Rudoy et al. | 439/108 |
| 5,046,960 | 9/1991 | Fedder | 439/608 |
| 5,057,028 | 10/1991 | Lemke et al. | 439/101 |
| 5,195,899 | 3/1993 | Yatsu et al. . | |
| 5,645,436 | 7/1997 | Shimizu et al. . | |
| 5,772,472 | 6/1998 | Beutler et al. | 439/608 |
| 5,913,690 | 6/1999 | Dechelette et al. | 439/108 |

OTHER PUBLICATIONS

Akama, Junichi et al., "High Density Connector for Differential Data Transfer", 30th Annual Connector and Interconnection Symposium and Trade SHow, Anaheim, California, Sep. 22–24, 1997, pp. 277–282.

Akama, Junichi et al., "High Density Connector for Differential Data Transfer", Technical Report of IEICE (Oct. 1997), pp. 25–29.

Primary Examiner—Khiem Nguyen
Assistant Examiner—Son V. Nguyen
Attorney, Agent, or Firm—Staas and Halsey, LLP

[57] ABSTRACT

A connector assembly used for balanced transmission includes a jack connector and a card-edge plug connector. The jack connector includes a plurality of pairs of jack-type signal contact elements arranged parallel to each other in an array, a plurality of jack-type ground plate elements arranged alternately with said plurality of pairs of jack-type signal contact elements in said array, a jack-type insulating body made of an electrically insulating material and jack-type ground contact element. The card-edge plug connector includes a plurality of pairs of plug-type signal pads, a plurality of slits arranged alternately with said plurality of pairs of plug-type signal pads, at least one plug-type ground layer and a plurality of signal patterns each extending from a respective one of said plug-type signal pads. The connector assembly has a strip-line structure. Also, virtual ground planes are created at a region between each pair of the plurality of pairs of plug-type signal pads.

17 Claims, 15 Drawing Sheets

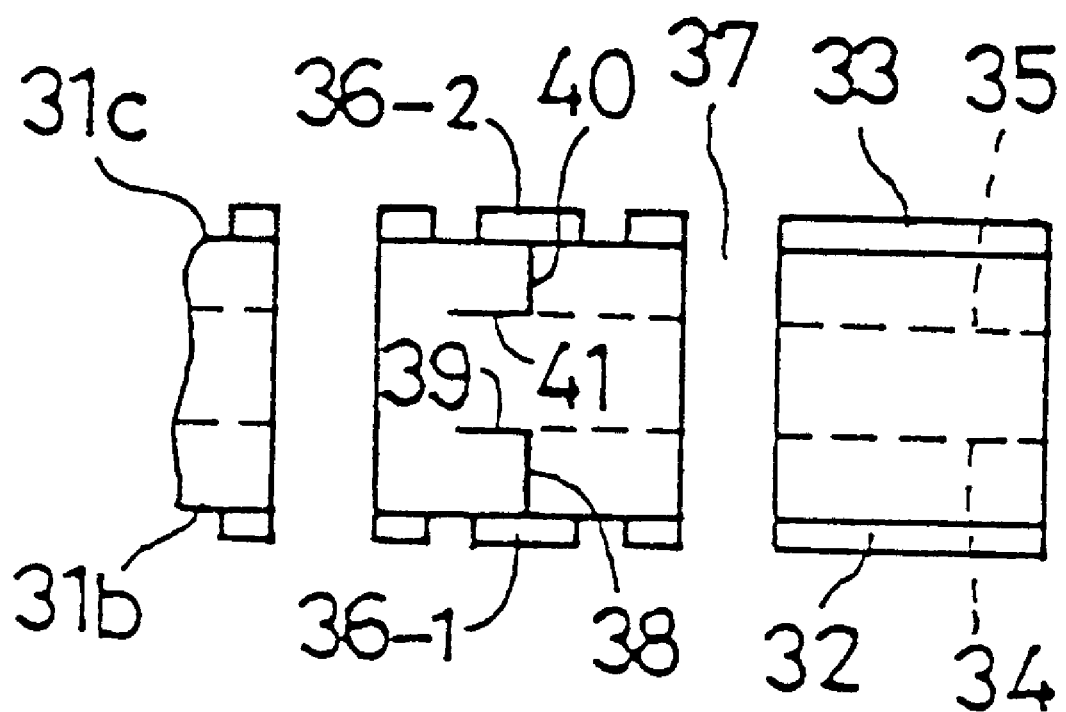

FIG. 6A
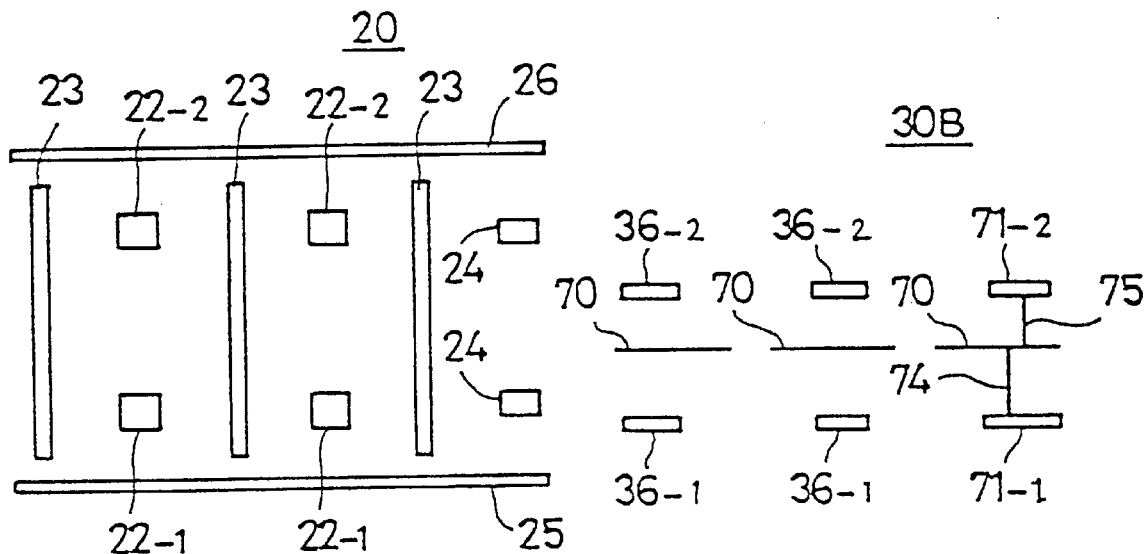
FIG. 6B
FIG. 6C
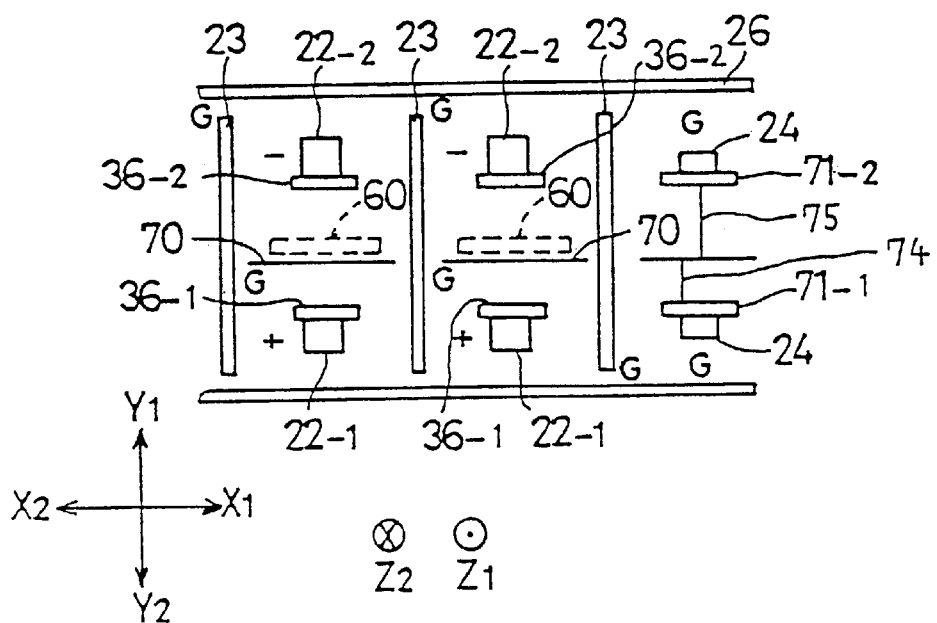

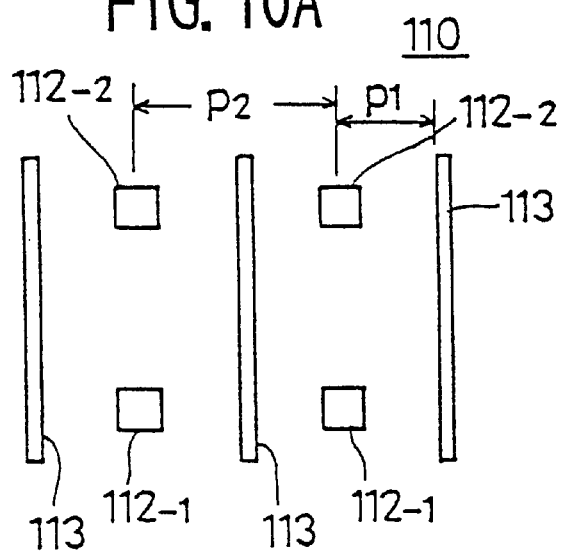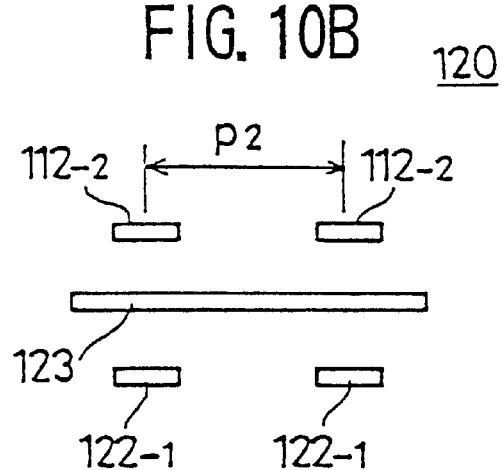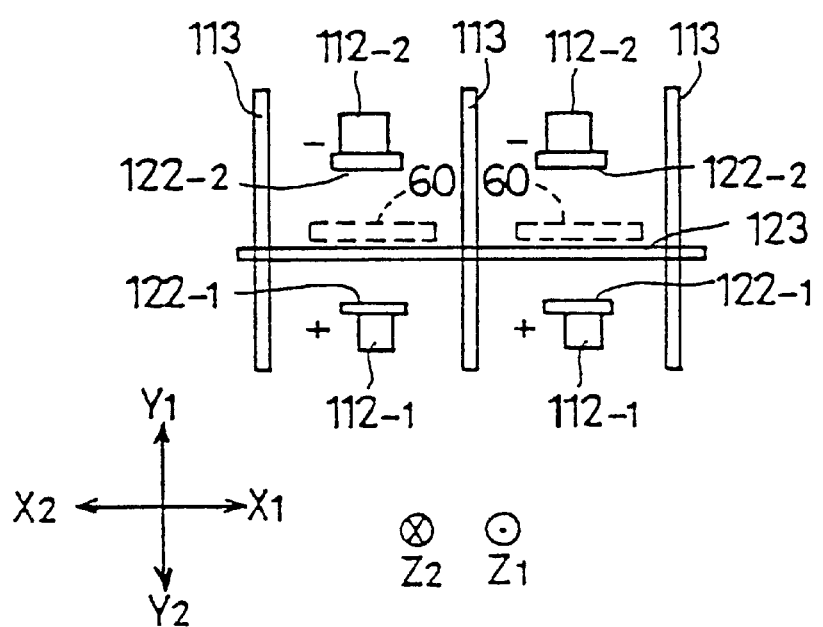

JACK CONNECTOR, PLUG CONNECTOR AND CONNECTOR ASSEMBLY

BACKGROUND OF THE INVENTION

1. Field of the Invention

The present invention generally relates to a jack connector, a plug connector and a connector assembly, and particularly relates to a connector assembly of a card-edge connector type used for balanced transmission.

2. Description of the Related Art

Conventional card-edge connector assemblies for connecting personal computers and peripheral equipment are designed for a use with an unbalanced transmission system. This is because the unbalanced transmission system is a major transmission system since it exhibits a good cost efficiency.

Recently, along with rapid improvement in personal computers and computer networks, there is a need for transmitting a large amount of data, particularly moving-image data. In order to transmit a large amount of moving-image data, a high-speed transmission of at least 1 gigabit/sec is required. However, the unbalanced transmission system is not suitable for such a high-speed transmission since it is easily affected by noise. Thus, in a high-speed transmission, a balanced transmission system is preferred since it is less affected by noise as compared to the unbalanced transmission system.

Therefore, there is a need for a jack connector, a plug connector and a connector assembly which can be used in a balanced transmission system.

SUMMARY OF THE INVENTION

Accordingly, it is a general object of the present invention to provide a jack connector, a plug connector and a connector assembly which can satisfy the needs described above.

It is another and more specific object of the present invention to provide a connector assembly which can effectively reduce a crosstalk between positive signals and negative signals.

In order to achieve the above object, a connector assembly used for balanced transmission includes a jack connector and a card-edge plug connector as described below.

The jack connector includes:
- a plurality of pairs of jack-type signal contact elements arranged parallel to each other in an array;
- a plurality of jack-type ground plate elements arranged alternately with the plurality of pairs of jack-type signal contact elements in the array;
- a jack-type insulating body made of an electrically insulating material for supporting the array including the plurality of pairs of jack-type signal and the plurality of pairs of jack-type ground plate elements; and
- jack-type ground contact means.

The card-edge plug connector includes:
- a plurality of pairs of plug-type signal pads, each pairs being arranged such that one of the pads is provided on one side of the card-edge plug connector and the other one of the pads is provided on the other side of the card-edge plug connector;
- a plurality of slits arranged alternately with the plurality of pairs of plug-type signal pads;
- at least one plug-type ground layer; and
- a plurality of signal patterns each extending from a respective one of the plug-type signal pads.

The connector assembly has a strip-line structure. Also, virtual ground planes are created at a region between each pair of the plurality of pairs of plug-type signal pads.

Further, in order to reinforce the virtual ground planes, the plug-type ground layer may be in the form of an internal ground layer provided inside the plug connector.

In another aspect of the present invention, there is provided a connector assembly for balanced transmission includes a jack connector and a plug connector as described below.

The jack connector includes:
- a plurality of pairs of jack-type signal contact elements arranged parallel to each other in an array;
- a plurality of jack-type ground plate elements arranged alternate with the plurality of pairs of jack-type signal contact elements in the array, the jack-type ground plate elements including two contact portions in the shape of a fork; and
- a jack-type insulating body made of an electrically insulating material.

The plug connector includes:
- a plug-type insulating body made of an electrically insulating material;
- a protruded member formed at the center of the plug-type insulating body, the protruded member being provided with a plurality of lateral slits and one longitudinal slit;
- a plurality of pairs of plug-type signal contact elements arranged parallel to each other in an array, each of the plug-type signal contact elements being disposed in respective one of the plurality of lateral slits; and
- a central ground element disposed in the longitudinal slit.

The connector assembly has a strip-line structure. Also, virtual ground planes are created at regions between the plug-type signal contact elements. Further, the virtual ground planes are reinforced by the central ground element.

BRIEF DESCRIPTION OF THE DRAWINGS

The above and other objects, features, and advantages of the present invention will become more apparent from the following description of preferred embodiments in connection with the accompanying drawings, in which:

FIG. 1B is a cross-sectional diagram taken along a line IB—IB in FIG. 1A.

FIGS. 6A to 6C are diagrams showing a basic structure of the connector assembly shown in FIG. 5A.

FIGS. 10A to 10C are diagrams showing a basic structure of the connector assembly shown in FIG. 9.

DETAILED DESCRIPTION OF THE PREFERRED EMBODIMENTS

Figure 1A:
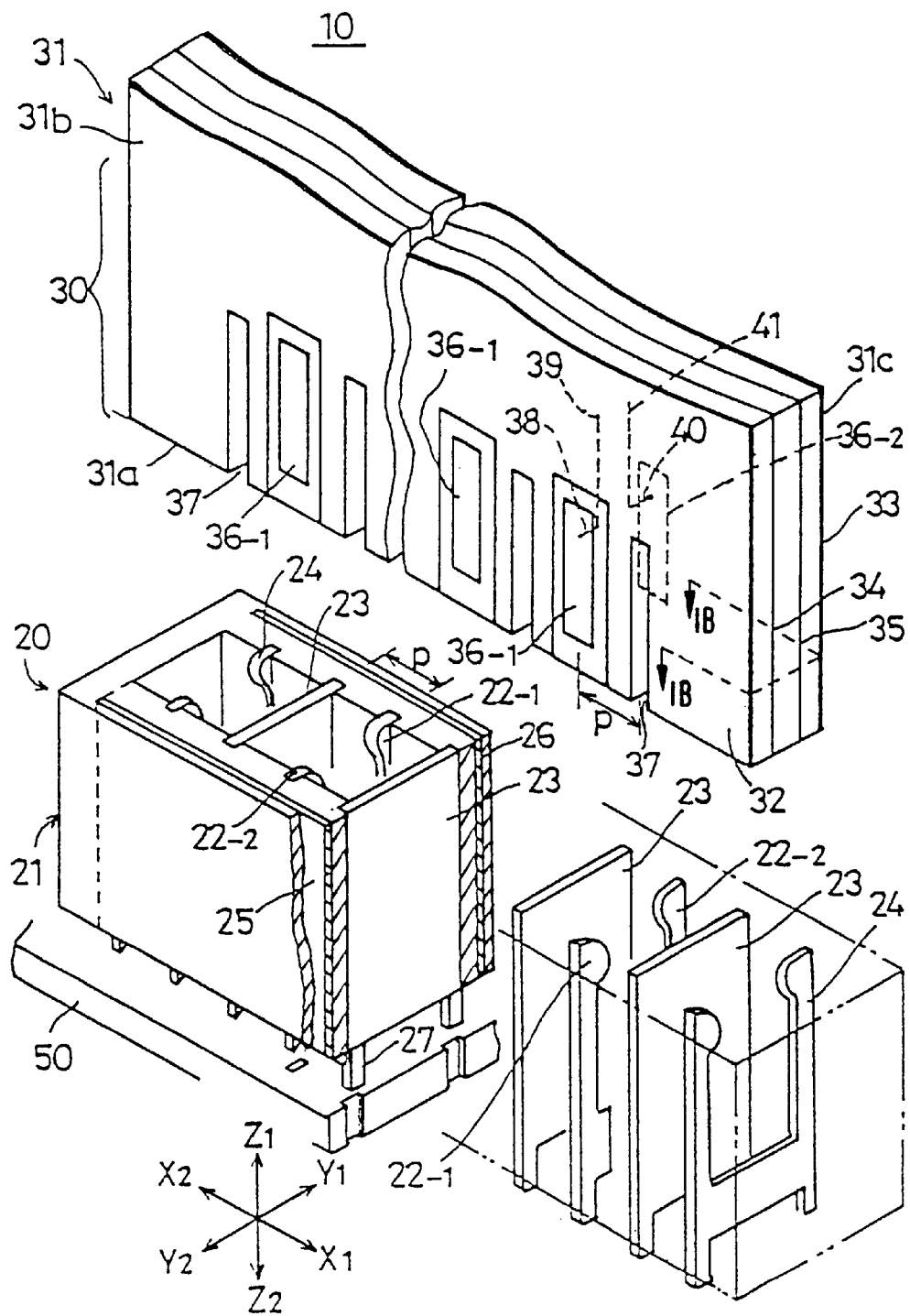
FIG. 1A is a perspective view showing a first embodiment of a card-edge type connector assembly used for balanced transmission according to the present invention.

Referring to the drawings, FIG. 1A shows a first embodiment of a card-edge type connector assembly 10 used for balanced transmission according to the present invention. The connector assembly 10 includes a jack connector 20 and a card-edge plug connector 30, each of which is designed for use in a balanced transmission system. FIG. 1B is a cross-sectional diagram taken along a line 1B—1B in FIG. 1A.

The jack connector 20 has an elongated shape and extends in X1–X2 directions. The jack connector 20 includes a jack-type insulating body 21 (hereinafter referred to as a jack insulator 21) and a plurality of frame ground elements 25, 26 (hereinafter referred to as jack frame grounds 25, 26). The jack insulator 21 holds a plurality of pairs of jack-type signal contact elements 22-1, 22-2, a plurality of ground plate elements 23, and at least two jack-type ground contact elements 24. The jack insulator 21 is made of an electrically insulating synthetic resin. Each of the ground plate elements 23 (hereinafter referred to as jack ground plates 23) has a plate-like shape. Each of the ground contact elements 24 (hereinafter referred to as jack ground contacts 24) has a shape of a fork. Also, the signal contact elements 22-1, 22-2 are hereinafter referred to as jack signal contacts 22-1, 22-2. The jack frame grounds 25, 26, each of which are rectangular, are assembled to the jack insulator 21, so as to cover either side of the jack insulator 21 in directions Y1–Y2.

The jack ground contacts 24 are provided adjacent to an X1-direction end and an X2-direction end of the jack insulator 21. The plurality of pairs of jack signal contacts 22-1, 22-2 are arranged parallel with each other in an array in the directions Y1–Y2. The plurality of pairs of jack signal contacts 22-1, 22-2 and the plurality of ground plate elements 23 are alternately arranged in a single row with the jack ground contacts 24 placed on either end of the row, respectively. Neighboring elements are placed at a pitch p. Terminals 27 of every one of the jack signal contacts 22-1, 22-2, ground plate elements 23, jack ground contacts 24 and frame ground elements 25, 26 protrude from the bottom side of the jack insulator 21. The ground plate element 23 has a size covering the projected area of the pair of jack signal contacts 22-1, 22-2 in the direction X1.

Figure 2A:
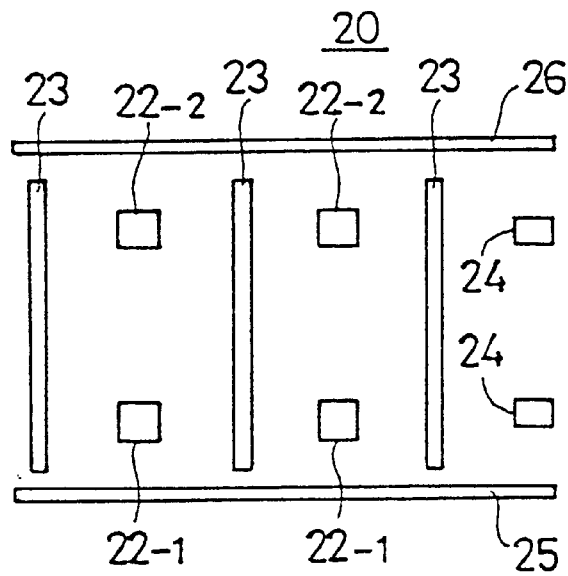
FIGS. 2A to 2C are diagrams showing a basic structure of the connector assembly shown in FIG. 1A.

Referring to FIG. 2A, at least one of the jack ground contacts 24 is provided at the X1-direction end and the plurality of pairs of jack signal contacts 22-1, 22-2 are positioned between two neighboring jack ground plates 23.

The jack connector 20 is mounted on a printed-circuit board 50 (hereinafter referred to as a circuit board 50) with each terminal 27 soldered on the circuit board 50. Thus, each of the terminals 27 of the jack signal contacts 22-1, 22-2 is connected to a signal pattern (not shown). Each of the terminals 27 of the jack ground plates 23 and the jack ground contacts 24 is connected to a ground pattern (not shown) provided on the circuit board 50. The jack frame grounds 25, 26 are also connected to the ground pattern (not shown) on the circuit board 50. Therefore, when in use, the jack ground plates 23, the jack ground contacts 24 and the jack frame grounds 25, 26 are at a ground electric potential.

The card-edge plug connector 30 is formed at a bottom side 31a of a printed circuit board 31 (hereinafter referred to as a circuit board 31) and has a structure corresponding to the jack connector 20.

The circuit board 31 includes a front-side ground layer 32, a backside ground layer 33 and two signal layers 34, 35. The front-side ground layer 32 is provided on a front side 31b and the backside ground layer 33 is provided on a backside 31c. The front-side ground layer 32 and the backside ground layer 33 are used for shielding internal signal patterns 39, 41, so that signals transmitted through the signal patterns 39 and 41 are less affected by external electromagnetic noise.

Figure 2B:
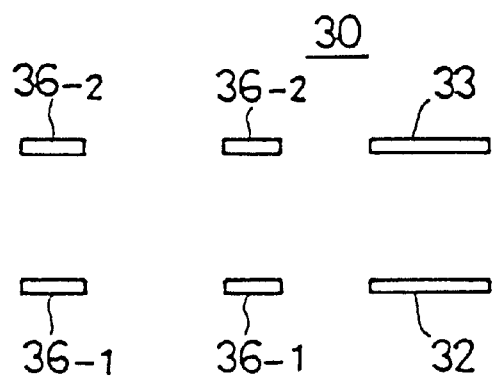

In the following, FIG. 2B is also referred to. A plurality of pairs of signal pads 36-1, 36-2 and a plurality of slits 37 are alternately arranged with the same pitch p. The signal pad 36-1 is provided on the front side 31b and the signal pad 36-2 is provided on the backside 31c. The slit 37 has a size corresponding to the jack ground plate 23. Each of the signal pads 36-1, 36-2 has an elongated shape in the directions Z1–Z2, and has a same size corresponding to the slit 37. The signal pad 36-1 is insulated from the front-side ground layer 32. The signal pad 362 is insulated from the backside ground layer 33. The signal pad 36-1 is connected to the signal pattern 39 of the signal layer 34 through a via 38. The signal pad 36-2 is connected to the signal pattern 41 of the signal layer 35 through a via 40.

In the following, a balanced transmission will be described, which may be established when the card-edge plug connector 30 is inserted in and connected to the jack connector 20.

Figure 2C:
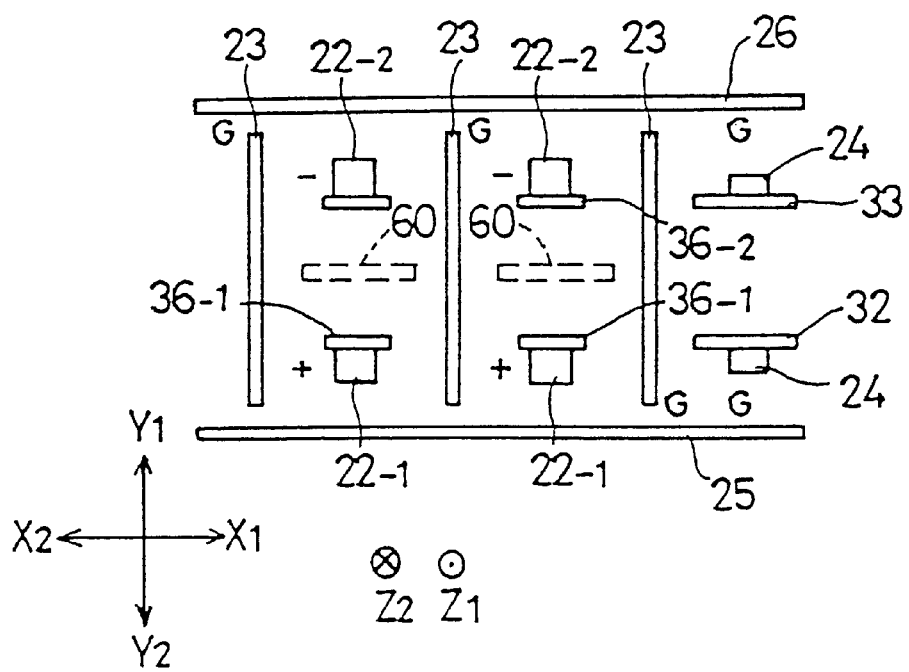

FIG. 2C is a diagram showing a state where the card-edge plug connector 30 is inserted into the jack connector 20. The jack signal contacts 22-1 are in contact with respective ones of the signal pads 36-1. The jack signal contacts 22-2 are in contact with respective ones of the signal pads 36-2. The jack ground contacts 24 are in contact with respective ones of the ground layers 32, 33. The ground plates 23 are inserted in the respective ones of the slits 37.

In the above-described state where the card-edge plug connector 30 is connected to the jack connector 20, the card-edge type connector assembly 10 for balanced transmission has the following three characteristics.

(1) Strip-line structure

As shown in FIG. 2C, the card-edge type connector assembly 10 has a strip-line structure which can reduce a crosstalk between signals transmitted through two neighboring pairs of jack signal contacts and signal pads.

The jack ground plates 23 are provided between two neighboring pairs of jack signal contacts 22-1, 22-2, which are arranged parallel with each other in an array. The jack signal contacts 22-1, 22-2 are in contact with the signal pads 36-1, 36-2, respectively.

Each of the jack ground plates 23 is connected to the ground layer 32, 33 of the circuit board 31 via a ground pattern (not shown) of the circuit board 50 and the jack ground contacts 24. Thus, each of the jack ground plates 23 has the same electric potential. Thereby, each of the jack ground plates 23 is used as a shield to reduce a crosstalk between two neighboring pairs of jack signal contacts 22-1, 22-2, which are in contact with respective pairs of the signal pads 36-1, 36-2.

In other words, each of the ground plates 23 is used as a shield between the neighboring pairs of signal pads 36-1, 36-2 when the card-edge plug connector 30 is connected to the jack connector 20.

Each of the ground plates 23 covers a projection area of a pair of signal contacts 22-1, 22-2 in the X1-direction as well as a projection area of a pair of signal pads 36-1, 36-2 in the X1-direction.

Since the card-edge type connector assembly 10 for a balanced transmission has a strip-line structure, it is possible to effectively reduce a crosstalk between the signals transmitted through the pairs of signal contacts and the signal pads which are arranged side by side in the X1–X2 directions.

(2) Virtual ground plane

A positive signal (+) is transmitted through the jack signal contact 22-1, which is in contact with the signal pad 36-1. A negative signal (−) is transmitted through the jack signal contact 22-2, which is in contact with the signal pad 36-2. The negative signal (−) and positive signal (+) are equal and opposite to each other.

There is an interaction between an electric field around the jack signal contact 22-1 and the signal pad 36-1 and an electric field around the jack signal contact 22-2 and the signal pad 36-2 at a region between the signal pads 36-1, 36-2 in the Y1–Y2 directions. Thereby, a virtual ground plane 60 is created at the region between the signal pads 36-1, 36-2, which are in contact with the jack signal contacts 22-1, 22-2, respectively.

Since the virtual ground plane 60 is created, it is possible to effectively reduce a crosstalk between the positive signal (+), which is transmitted through the signal contact 22-1 and the signal pad 36-1, and the negative signal (−), which is transmitted through the signal contact 22-2 and the signal pad 36-2.

(3) External shield

The jack frame ground 25 is used for shielding the Y2 side of the jack signal contact 22-1 and the signal pad 36-1 which are in contact with each other. The jack frame ground 26 is used for shielding the Y1 side of the jack signal contact 22-2 and the signal pad 36-2 which are in contact with each other.

Therefore, the positive signal (+) and the negative signal (−), both of which are transmitted through the card-edge type connector assembly 10, are less affected by external electromagnetic waves from outside the assembly 10. Also, it becomes easier to adjust an impedance of the card-edge type connector assembly 10.

In the following description of the second to fourth embodiments, the same elements as those of the elements of the first embodiment are indicated with the same reference numbers and the elements corresponding to the elements of the first embodiment are indicated with the reference numbers with indexes such as A and B. Also, further description is omitted for the same elements as those of the elements of the first embodiment.

Figure 3A:
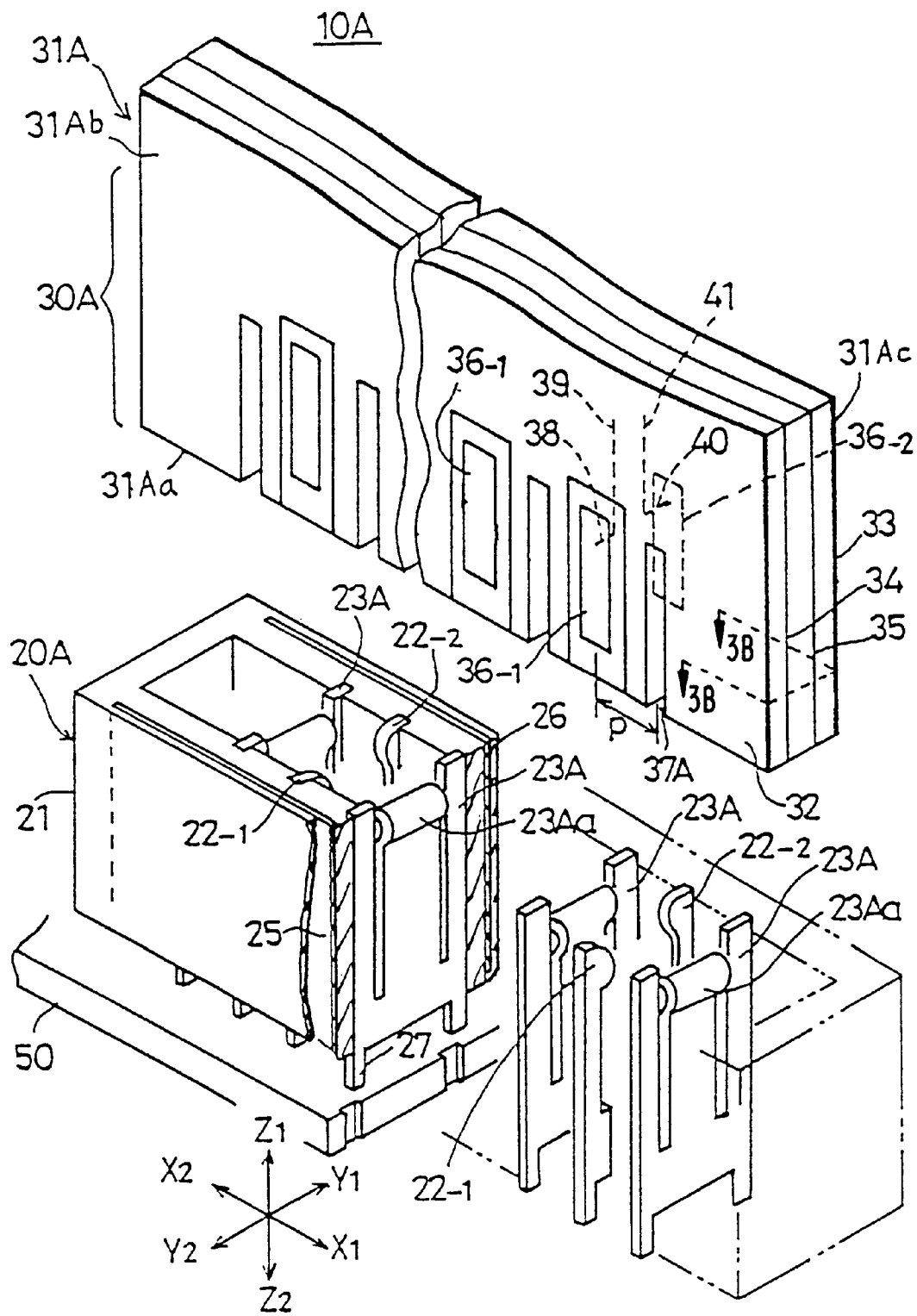
FIG. 3A is a perspective view showing a second embodiment of a card-edge type connector assembly used for balanced transmission according to the present invention.
Figure 3B:
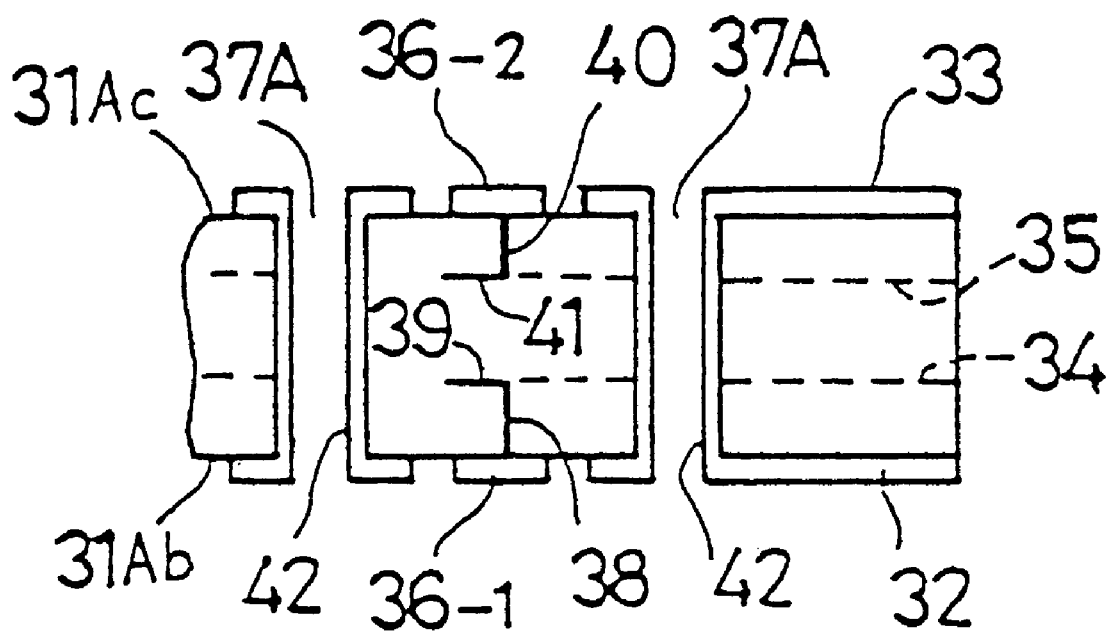
FIG. 3B is a cross-sectional diagram taken along a line 3B—3B in FIG. 3A.

FIG. 3A shows a second embodiment of a card-edge type connector assembly 10A used for balanced transmission according to the present invention. The connector assembly 10A is a variant of the first embodiment shown in FIG. 1A. The connector assembly 10A includes a jack connector 20A and a card-edge plug connector 30A, each of which are designed for use in a balanced transmission system. FIG. 3B is a cross-sectional diagram taken along a line 3B—3B in FIG. 5A.

Figure 4A:
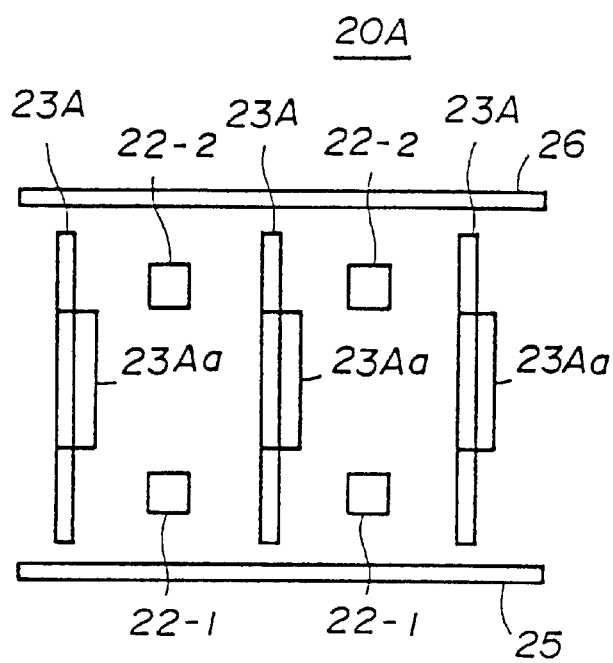
FIGS. 4A to 4C are diagrams showing a basic structure of the connector assembly shown in FIG. 3A.

The jack connector 20A is similar to the jack connector 20 shown in FIG. 1A. Also referring to FIG. 4A, each of a plurality of jack ground plates 23A is provided with a contact part 23Aa having a spring-like feature in the X1–X2 directions. The jack connector 20A is not provided with any jack ground contact element which is equivalent to the jack ground contact 24 shown in FIG. 1A.

Figure 4B:
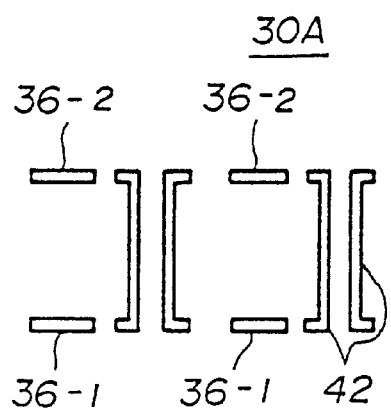

The card-edge plug connector 30A is provided with a plurality of slits 37A. As shown in FIGS. 3B and 4B, the slit 37A is provided with slit ground layers 42 disposed on the inner walls. The ground layers 42 extend from the ground layers 32, 33 and are formed by plating.

Figure 4C:
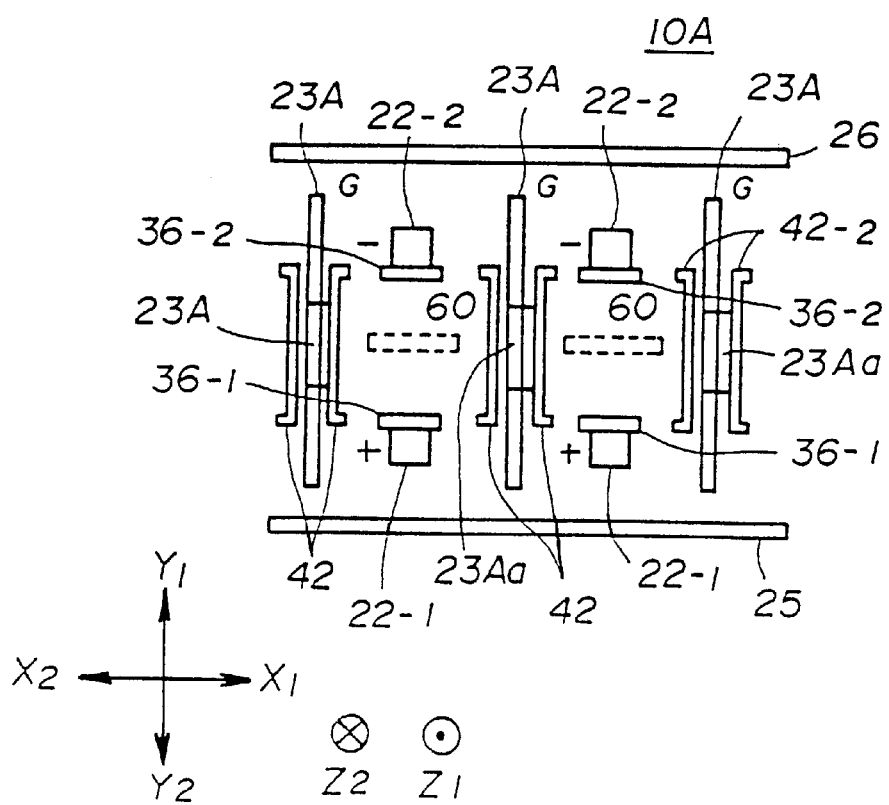

FIG. 4C is a diagram showing a state where the card-edge plug connector 30A is inserted into the jack connector 20A. The jack signal contacts 22-1 are in contact with respective ones of the signal pads 36-1. The jack signal contacts 22-2 are in contact with respective ones of the signal pads 36-2. The ground plates 23A are inserted in the respective ones of the slits 37A, so that the contact parts 23Aa will be in contact with the respective slit ground layers 42. Therefore, the ground plates 23Aa will be at the same electric potential as that of the ground layers 32, 33 of the card-edge plug connector 30A (or the circuit board 31). Thus, the ground plate 23 is used as a shield between two neighboring parallel pairs of jack signal contacts 22-1, 22-2 and between neighboring pairs of signal pads 36-1, 36-2.

In the present embodiment, the card-edge type connector assembly 10A includes the plurality of ground plates 23A each provided with the contact part 23Aa and the ground layer 42 provided on the inner walls of the slits 37A. Therefore, it is possible to omit the ground contacts 24 because the contact parts 23Aa are in contact with the ground layers 42.

The card-edge type connector assembly 10A has the same characteristics as those of the connector assembly 10 shown in FIG. 1A, the characteristics being the strip-line structure, the virtual ground plane 60 and the external shield. Further, the card-edge type connector assembly 10A has a comparatively simple structure since the ground contacts 24 of the above-described connector assembly 10 have been omitted.

Figure 5A:
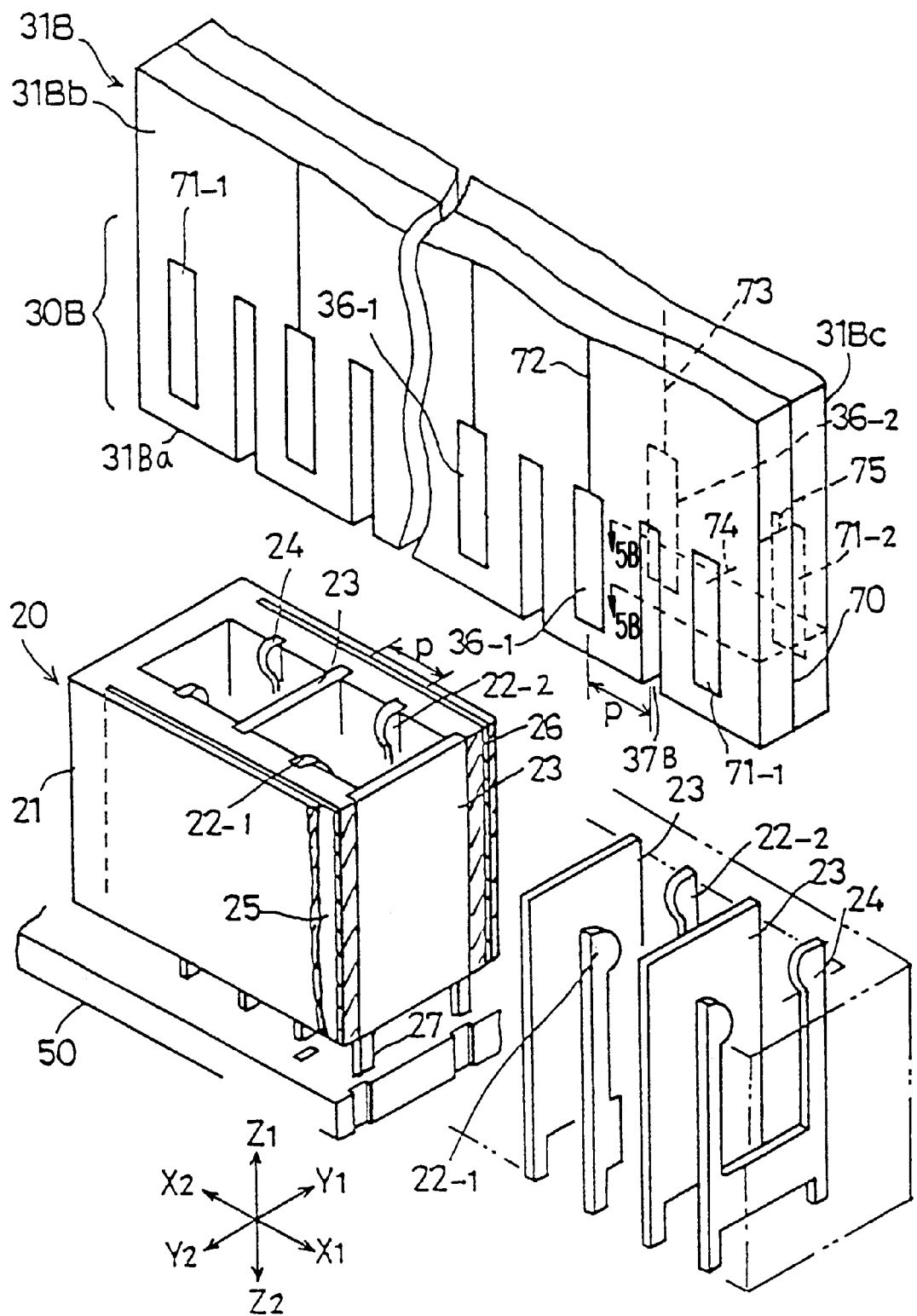
FIG. 5A is a perspective view showing a third embodiment of a card-edge type connector assembly used for balanced transmission according to the present invention.
Figure 5B:
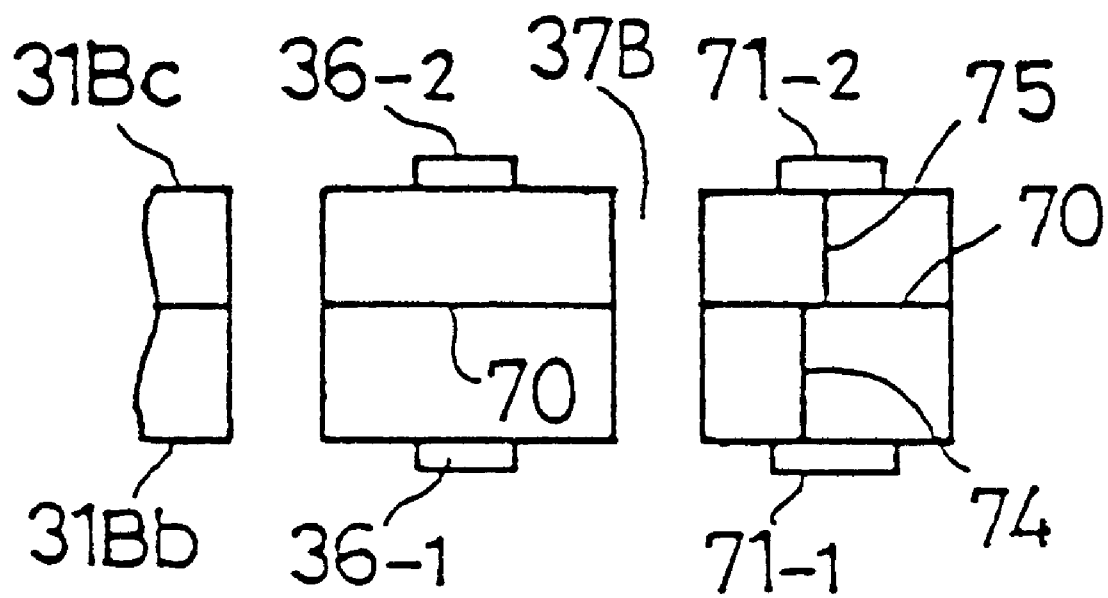
FIG. 5B is a cross-sectional diagram taken along a line 5B—5B in FIG. 5A.

FIG. 5A shows a third embodiment of a card-edge type connector assembly 10B used for balanced transmission according to the present invention. The connector assembly 10B includes the jack connector 20 and a card-edge plug connector 30B, each of which are designed for use in a balanced transmission system. FIG. 5B is a cross-sectional diagram taken along a line 5B—5B in FIG. 5A.

The jack connector 20 is the same as the jack connector 20 shown in FIG. 1A and has a structure as shown in FIG. 6A.

As shown in FIGS. 5A, 5B and 6A, the card-edge plug connector 30B includes a ground layer 70 provided inside a circuit board 31B. Also, a plurality of pairs of signal pads 36-1, 36-2 and a plurality of slits 37B are alternately arranged with the same pitch p. Ground pads 71-1, 71-2 are provided at both the X1 and X2 direction ends. The signal pad 36-1 and the ground pad 71-1 are provided on the front side 31Bb and the signal pad 36-2 and the ground pad 71-2 are provided on the backside 31Bc. The signal pad 36-1 is provided with a signal pattern 72 extending therefrom. Also, the signal pad 36-2 is provided with a signal pattern 73 extending therefrom. The ground pad 71-1 is connected to the ground layer 70 through a via 74. The ground pad 71-2 is connected to the ground layer 70 through a via 75.

FIG. 6C is a diagram showing a state where the card-edge plug connector 30B is inserted into the jack connector 20.

The jack signal contacts 22-1 are in contact with respective ones of the signal pads 36-1. The jack signal contacts 22-2 are in contact with respective ones of the signal pads 36-2. The jack ground contacts 24 are in contact with respective ones of the ground pads 71-1, 71-2. The ground plates 23 are inserted in the respective ones of the slits 37B.

The card-edge type connector assembly 10B has the same characteristics as those of the connector assembly 10 shown in FIG. 1A, the characteristics being the strip-line structure, the virtual ground plane 60 and the external shield.

As shown in FIG. 6C, the ground layer 70 is positioned at the region between the signal pads 36-1, 36-2 and between the jack signal contacts 22-1, 22-2 which are in contact with the signal pads 36-1, 36-2, respectively. The ground layer 70 is used for reinforcing the virtual ground plane 60. Therefore, it is possible to effectively reduce a crosstalk between the positive signals (+) and the negative signals (−).

Figure 7A:
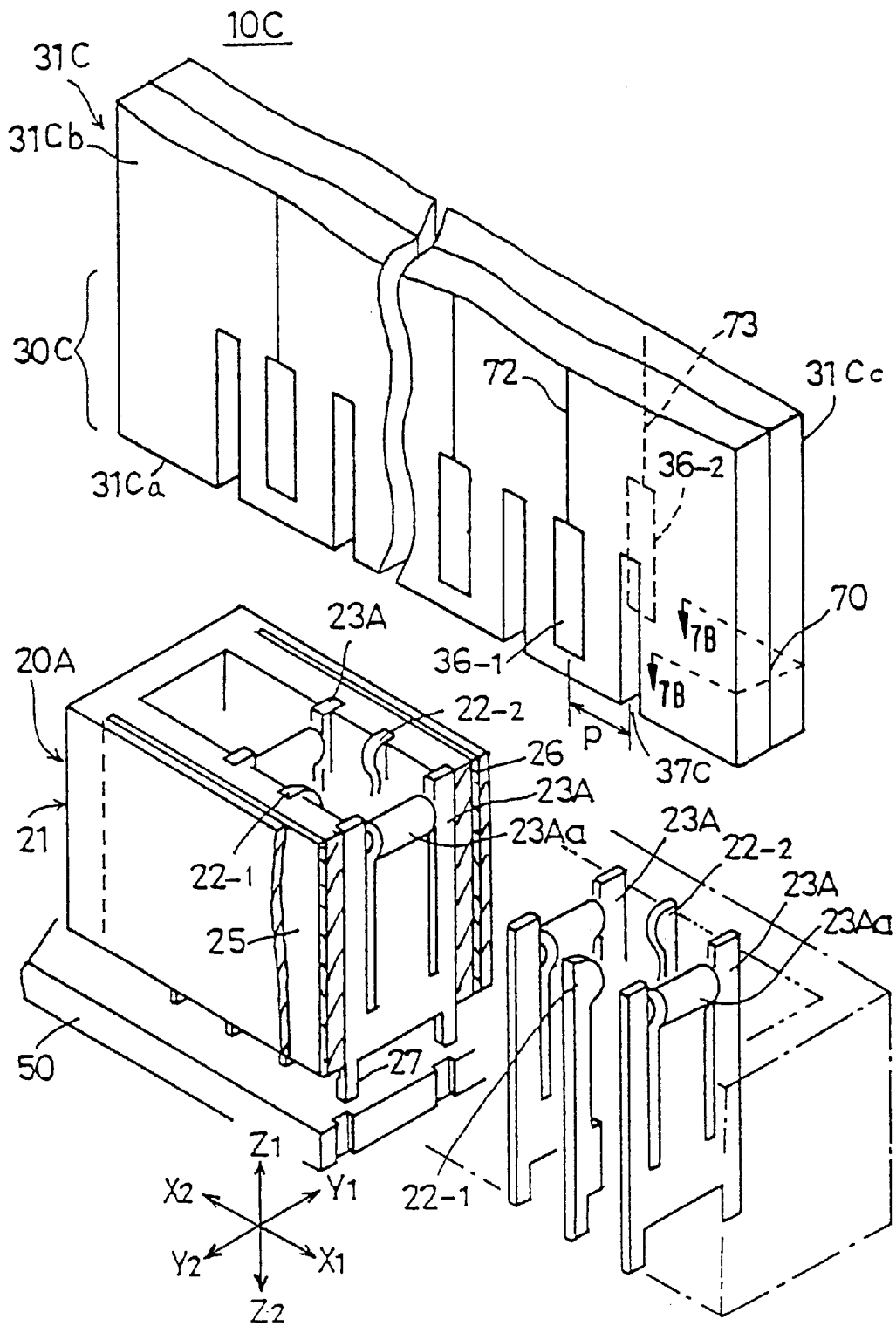
FIG. 7A is a perspective view showing a fourth embodiment of a card-edge type connector assembly used for balanced transmission according to the present invention.
Figure 7B:
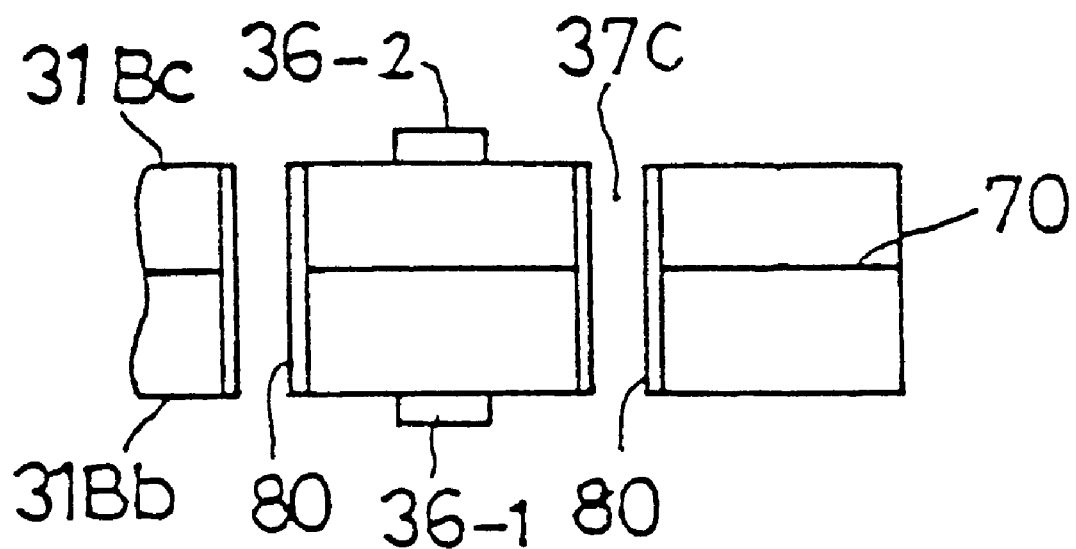
FIG. 7B is a cross-sectional diagram taken along a line 7B—7B in FIG. 7A.

FIG. 7A shows a fourth embodiment of a card-edge type connector assembly 10C used for balanced transmission according to the present invention. The connector assembly 10C is a variant of the third embodiment shown in FIG. 5A. The connector assembly 10C includes the jack connector 20A and a card-edge plug connector 30C, each of which are designed for use in a balanced transmission system. FIG. 7B is a cross-sectional diagram taken along a line 7B—7B in FIG. 7A.

The jack connector 20A is the same as the jack connector 20A shown in FIG. 3A and is provided with a contact part 23Aa having a spring-like feature in the X1–X2 directions. The jack connector 20A is not provided with any ground contact element which is equivalent to the jack ground contact 24 shown in FIG. 1A.

Figure 8A:
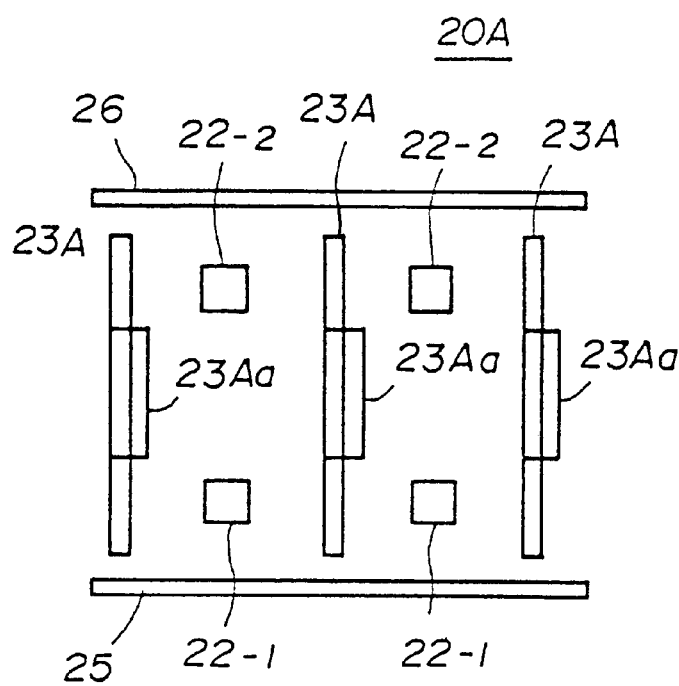
FIGS. 8A to 8C are diagrams showing a basic structure of the connector assembly shown in FIG. 7A.
Figure 8B:
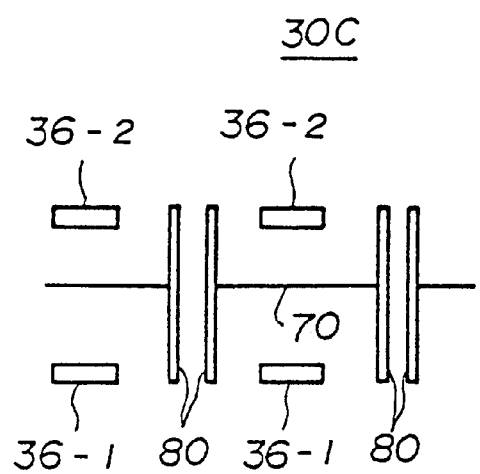

The card-edge plug connector 30C is similar to the card-edge plug connector 30B shown in FIG. 5A. Also, as shown in FIG. 8B, the card-edge plug connector 30C is provided with a plurality of slits 37C. As shown in FIGS. 7B and 8B, slit ground layers 80 made of plating are provided on the inner walls of the slit 37C. Also, the ground layers 80 are electrically connected to the ground layer 70. No elements equivalent to the ground pads 71-1, 71-2 in FIG. 5A are provided.

Figure 8C:
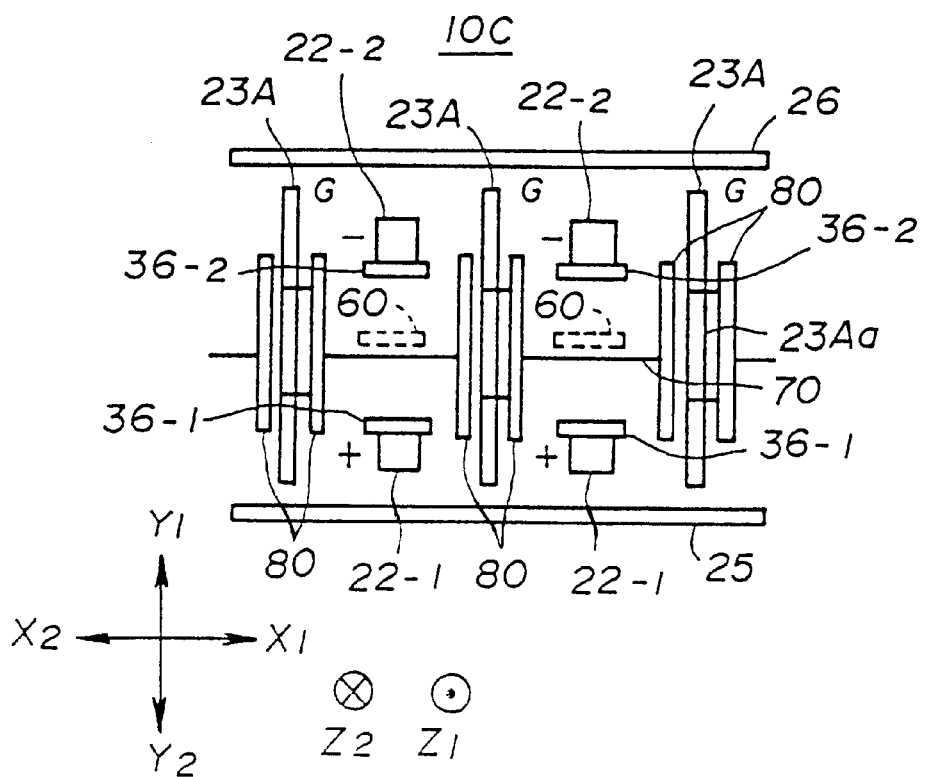

FIG. 8C is a diagram showing a state where the card-edge plug connector 30C is inserted into the jack connector 20A. The jack signal contacts 22-1 are in contact with respective ones of the signal pads 36-1. The jack signal contacts 22-2 are in contact with respective ones of the signal pads 36-2. The ground plates 23A are inserted in the respective ones of the slits 37C, so that the contact parts 23Aa are in contact with the slit ground layers 80. Therefore, the ground plates 23A will be at the same electric potential as that of the ground layer 80 of the card-edge plug connector 30C (or the circuit board 31C). Thus, the ground plate 23A is used as a shield between two neighboring parallel pairs of jack signal contacts 22-1, 22-2 and between neighboring pairs of signal pads 36-1, 36-2.

In the present embodiment, the card-edge type connector assembly 10C includes the plurality of ground plates 23A each provided with the contact part 23Aa and the ground layers 80 provided on the inner walls of the slits 37C. Therefore, it is possible to omit ground contacts 24 because the contact parts 23Aa are in contact with the ground layers 80.

The card-edge type connector assembly 10C has the same characteristics as those of the connector assembly 10B shown in FIG. 5A, the characteristics being the strip-line structure, the virtual ground plane 60 and the external shield.

Further, the card-edge type connector assembly 10A has the ground layer 80 for reinforcing the virtual ground plane 60 and has a comparatively simple structure since the ground contact 24 of the connector assembly 10B is omitted.

Figure 9:
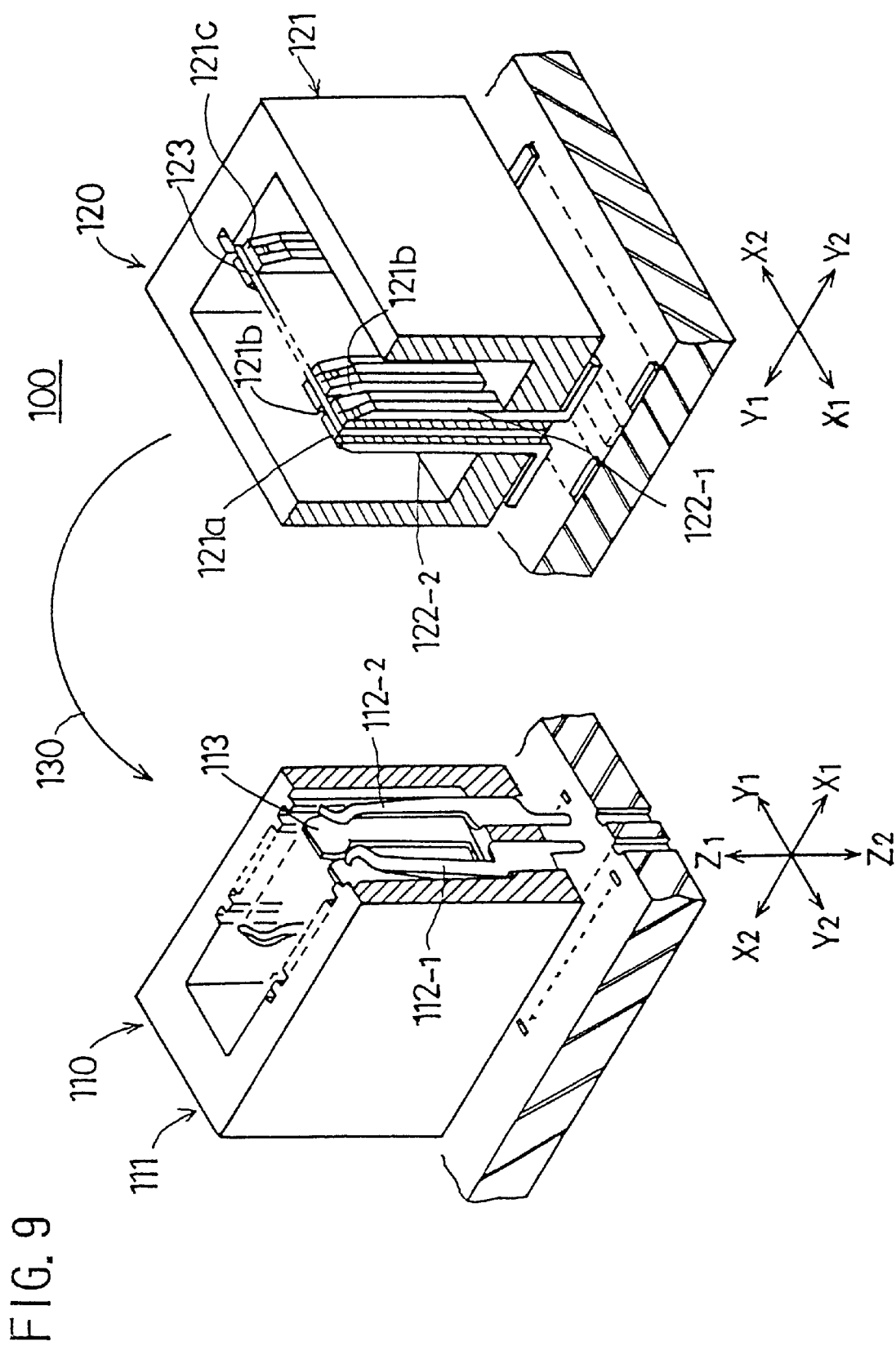
FIG. 9 is a perspective view showing a fifth embodiment of a card-edge type connector assembly used for balanced transmission according to the present invention.

FIG. 9 shows a fifth embodiment of a connector assembly 100 used for balanced transmission according to the present invention. The connector assembly 100 includes a jack connector 110 and a plug connector 120, each of which is designed for use in a balanced transmission system.

The jack connector 110 has an elongated shape and extends in X1–X2 directions. Also referring to FIG. 10A, the jack connector 110 includes a jack-type electrically insulating body 111, a plurality of pairs of jack-type signal contact elements 112-1, 112-2 and at least two jack-type ground contact elements 113. The plurality of pairs of jack-type signal contact elements 112-1, 112-2 are hereinafter referred to as jack signal contacts 112-1, 112-2. Also, the plurality of jack-type ground contact elements 113 are hereinafter referred to as jack ground contacts 113. The jack-type insulating body 111 (hereinafter referred to as a jack insulator 111) is made of an electrically insulating synthetic resin.

Figure 11A:
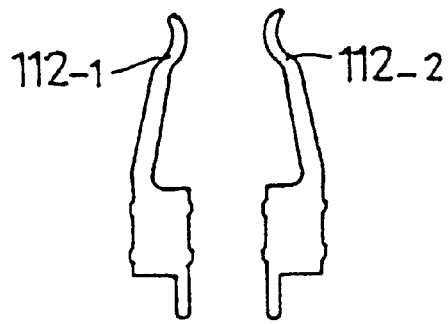
FIGS. 11A to 11D are diagrams showing elements used in the connector assembly shown in FIG. 9.
Figure 11B:
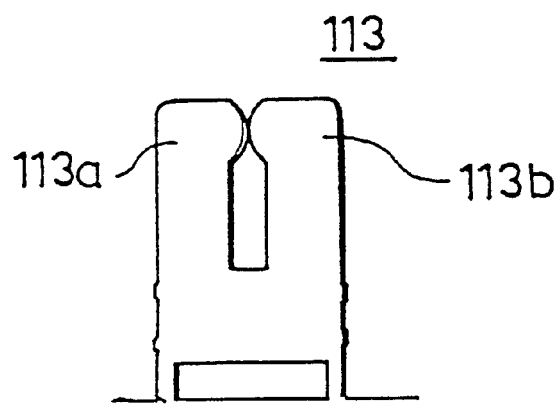

Each of the pair of jack signal contacts 112-1, 112-2 has a shape as shown in FIG. 11A, and is arranged opposite to each other in Y1–Y2 directions. The jack ground contact 113 has a pair of contact portions 113a, 113b in the shape of a fork as shown in FIG. 11B. The jack ground contact 113 holds a central ground element 123 between the contact portions 113a, 113b.

Referring to FIG. 10A, the plurality of pairs of jack signal contacts 112-1, 112-2 and the plurality of jack ground contacts 113 are alternately arranged in a single row at a pitch p1 of 0.635 mm. Neighboring pairs of jack signal contacts 112-1, 112-2 are placed at a pitch p2 of 1.27 mm.

The plug connector 120 has a structure corresponding to the jack connector 110. The plug connector 120 has an elongated shape and extends in the X1–X2 directions. Also referring to FIG. 10B, the plug connector 120 includes a plug-type electrically insulating body 121, a plurality of pairs of plug-type signal contact elements 122-1, 122-2 (hereinafter referred to as plug signal contacts 122-1, 122-2) and the central ground element 123. The plug-type electrically insulating body 121 (hereinafter referred to as a plug insulator 121) is made of an electrically insulating synthetic resin.

Figure 11C:
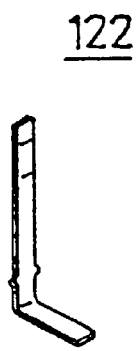
Figure 11D:
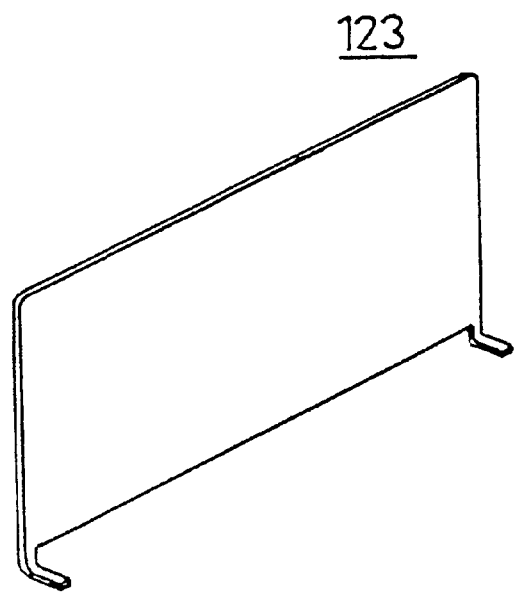

The plug insulator 121 has a protruded member 121a at the central part of the plug insulator 121 in the X1–X2 directions. Each of the pair of plug signal contacts 122-1, 122-2 has a shape shown in FIG. 11C and is provided on either side of the protruded member 121a in Y1–Y2 directions. The pairs of plug signal contacts 122-1, 122-2 are arranged in a single row at the pitch p2 which is twice as large as the pitch p1. The protruded member 121a is provided with lateral slits 121b traversing in the Y1–Y2 directions which lateral slits 121b are provided at an equal distance from the neighboring pairs of plug signal contacts 122-1, 122-2. The protruded member 121a is also provided with a long slit 121c in the X1–X2 directions. The central ground element 123, which is shown in FIG. 11D, is inserted into the slit 121c. The central ground element 123 traverses between the pairs of plug signal contacts 122-1, 122-2. and between the slits 121b.

The plurality of pairs of plug signal contacts 122-1, 122-2 and the plurality of slits 121b are alternately arranged in a single row with a pitch p1 in the X1–X2 directions. The central ground element 123 is exposed at the inner part of the slits 121b. The plurality of pairs of plug signal contacts 122-1, 122-2 are arranged in a single row with a pitch p2 in the X1–X2 directions.

As shown in FIG. 9, the plug connector 120 is connected to the jack connector 110 in a reversed position indicated by an arrow 130. As shown in FIG. 10C, the jack signal contacts 112-1 are in contact with respective ones of the plug signal contacts 122-1. The jack signal contacts 112-2 are in contact with respective ones of the plug signal contacts 122-2. The contact portions 113a, 113b are fitted into the slits 121b and come into contact with the central ground element 123.

Each of the jack ground contacts 113 is used as a shield between two parallel pairs of jack signal contacts 112-1, 112-2 arranged side by side, and between two parallel pairs of plug signal contacts 122-1, 122-2 arranged side by side. Thereby, the connector assembly 100 is of a strip-line structure, so that a crosstalk is effectively reduced between signals transmitted through two parallel pairs of plug signal contacts 122-1, 122-2 arranged side by side.

Also, a positive signal (+) is transmitted through the jack signal contact 112-1 and the plug signal contact 122-1, which is in contact with the jack signal contact 112-1. A negative signal (−) is transmitted through the jack signal contact 112-2 and the plug signal contact 122-2, which is in contact with the jack signal contact 112-2. The negative signal (−) and the positive signal (+) are equal and opposite to each other.

Thus, a virtual ground plane 60 is created at the region between the plug signal contacts 122-1, 122-2 and between the jack signal contacts 112-1, 112-2 which are in contact with the plug signal contacts 122-1, 122-2, respectively.

Since the virtual ground plane 60 is created, it is possible to effectively reduce a crosstalk between the positive signal (+) transmitted through the jack signal contact 112-1 and the plug signal contact 122-1 and the negative signal (−) transmitted through the jack signal contact 112-2 and the plug signal contact 122-2.

The central ground element 123 is provided at the position where the virtual ground plane 60 is located. The central ground element 123 is used for reinforcing the virtual ground plane 60. Therefore, it is possible to effectively reduce a crosstalk between the positive signals (+) and the negative signals (−).

Further, the present invention is not limited to these embodiments, but variations and modifications may be made without departing from the scope of the present invention.

The present application is based on Japanese priority application No. 10-230891 filed on Aug. 17, 1998, the entire contents of which are hereby incorporated by reference.

What is claimed is:

1. A card-edge plug connector for balanced transmission, comprising:
   a card edge having first and second sides;
   a plurality of pairs of plug-type signal pads, each pair being arranged such that one pad of each said pair of pads is provided on the first side of the card-edge and the other pad of each said pair of pads is provided on the second side of the card-edge;
   a plurality of slits in said card edge arranged alternately with said plurality of pairs of plug-type signal pads;
   at least one plug-type ground layer; and
   a plurality of signal patterns each extending from a respective one of said plug-type signal pads.

2. The card-edge plug connector as claimed in claim 1, further comprising first and second plug-type signal layers provided inside the plug connector,
   wherein said at least one plug-type ground layer includes a first plug-type ground layer provided on one side of the connector and a second plug-type ground layer provided on the other side of the connector,
   said first plug-type signal layer being provided at a position closer to said first plug-type ground layer and said second plug-type signal layer being provided at a position closer to said second plug-type ground layer, and
   said plurality of signal patterns are connected to said first and second plug-type signal layers.

3. The card-edge plug connector as claimed in claim 2, wherein said plurality of slits are provided with slit ground layers formed on inner walls of the slits, said slits being formed integrally with said first and second plug-type ground layers.

4. The card-edge plug connector as claimed in claim 1, further comprising at least two pairs of plug-type ground pads;
   wherein said at least one plug-type ground layer includes an internal ground layer provided inside the plug connector, said internal ground layer being electrically connected to said at least two pairs of plug-type ground pads through ground patterns.

5. The card-edge plug connector as claimed in claim 1, wherein said at least one plug-type ground layer includes an internal ground layer provided inside the plug connector; and
   said plurality of slits are provided with slit ground layers formed on inner walls of the slits, said slit ground layers being electrically connected to said internal ground layer.

6. A connector assembly for balanced transmission comprising:
   a jack connector including:
   a plurality of pairs of jack-type signal contact elements arranged parallel to each other in an array;
   a plurality of jack-type ground plate elements, arranged alternately with said plurality of pairs of jack-type signal contact elements in said array;
   a jack-type insulating body made of an electrically insulating material for supporting said array including said plurality of pairs of jack-type signal and said plurality of pairs of jack-type ground plate elements; and
   jack-type ground contact means, and
   a card-edge plug connector including:
   a card edge having first and second sides;
   a plurality of pairs of plug-type signal pads, each pair of pads being arranged such that one pad of each said pair of pads is provided on the first side of the card edge and the other pad of each said pair of pads is provided on the second side of the card-edge plug connector;
   a plurality of slits in said card edge, said slits arranged alternately with said plurality of pairs of plug-type signal pads;
   at least one plug-type ground layer; and
   a plurality of signal patterns each extending from a respective one of said plug-type signal pads,
   wherein the connector assembly has a strip-line structure, and
   virtual ground planes are created at a region between each pair of the plurality of pairs of plug-type signal pads.

7. The connector assembly as claimed in claim 6, wherein said jack-type ground contact means includes first and second jack-type ground contact elements, the first of said jack-type ground contact elements being arranged at a first end of said array and the second of said jack-type ground contact elements being arranged at a second end of said array.

8. The connector assembly as claimed in claim 7,
further comprising first and second plug-type signal layers provided inside the plug connector,
wherein said at least one plug-type ground layer includes a first plug-type ground layer provided on one side of the connector and a second plug-type ground layer provided on the other side of the connector,
said first plug-type signal layer being provided at a position closer to said first plug-type ground layer and said second plug-type signal layer being provided at a position closer to said second plug-type ground layer, and
said plurality of signal patterns are connected to said first and second plug-type signal layers.

9. The connector assembly as claimed in claim 7, wherein said card-edge plug connector further comprises at least two pairs of plug-type ground pads;
wherein said at least one plug-type ground layer includes an internal ground layer provided inside the plug connector, said internal ground layer being electrically connected to said at least two pairs of plug-type ground pads through ground patterns, and said virtual ground planes are reinforced by said internal ground layer.

10. The connector assembly as claimed in claim 6, wherein said jack-type ground contact means includes jack-type contact parts provided on said jack-type ground plate elements, said jack-type contact parts having a spring-like feature in a direction parallel to said array.

11. The connector assembly as claimed in claim 10, wherein said card-edge plug connector further comprises first and second plug-type signal layers provided inside the plug connector,
wherein said at least one plug-type ground layer includes a first plug-type ground layer provided on one side of the connector and a second plug-type ground layer provided on the other side of the connector,
said first plug-type signal layer being provided at a position closer to said first plug-type ground layer and said second plug-type signal layer being provided at a position closer to said second plug-type ground layer,
said plurality of signal patterns are connected to said first and second plug-type signal layers, and
said plurality of slits are provided with slit ground layers formed on inner walls of the slits, said slits being formed integrally with said first and second plug-type ground layers.

12. The connector assembly as claimed in claim 10,
wherein said at least one plug-type ground layer includes an internal ground layer provided inside the plug connector; and
said plurality of slits are provided with slit ground layers formed on inner walls of the slits, said slit ground layers being electrically connected to said internal ground layer and said virtual ground planes are reinforced by said internal ground layer.

13. The connector assembly as claimed in claim 6, wherein the jack connector further comprises at least two frame ground elements disposed outside said electrically insulating body and perpendicular to said plurality of pairs of signal contact elements and said plurality of ground contact elements, one of said frame ground element being provided on one side of the jack connector and the other one of said frame ground element being provided on the other side of the jack connector.

14. A plug connector for balanced transmission comprising:
a plug-type insulating body made of an electrically insulating material, said body having first and second edges;
a protruded member formed on said plug-type insulating body, said protruded member centrally located between said first and second edges, said protruded member being provided with a plurality of lateral slits and one longitudinal slit;
a plurality of pairs of plug-type signal contact elements arranged parallel to each other in an array, each of said plug-type signal contact elements being disposed in a respective one of said plurality of lateral slits; and
a central ground element disposed in said longitudinal slit.

15. The connector assembly for balanced transmission as claimed in claim 14, wherein said plug-type insulating body has a cavity with first and second side walls, and a bottom and said protruded member rises from said bottom midway between said first and second side walls.

16. A connector assembly for balanced transmission comprising:
a jack connector including:
a plurality of pairs of jack-type signal contact elements arranged parallel to each other in an array;
a plurality of jack-type ground plate elements arranged alternately with said plurality of pairs of jack-type signal contact elements in said array, said jack-type ground plate elements including two contact portions in the shape of a fork; and
a jack-type insulating body made of an electrically insulating material for supporting said array including said plurality of pairs of jack-type signal and said plurality of pairs of jack-type ground plate elements, and
a plug connector including:
a plug-type insulating body made of an electrically insulating material, said body having first and second edges;
a protruded member formed on said plug-type insulating body, said protruded member centrally located between said first and second edges, said protruded member being provided with a plurality of lateral slits and one longitudinal slit;
a plurality of pairs of plug-type signal contact elements arranged parallel to each other in an array, each of said plug-type signal contact elements being disposed in a respective one of said plurality of lateral slits; and
a central ground element disposed in said longitudinal slit,
wherein the connector assembly has a strip-line structure,
virtual ground planes are created at a region between the plug-type signal contact elements, and
said virtual ground planes are reinforced by said central ground element.

17. The connector assembly for balanced transmission as claimed in claim 16, wherein said plug-type insulating body has a cavity with first and second side walls and a bottom wall and said protruded member rises from said bottom wall midway between said first and second side walls.

* * * * *